(12) United States Patent
Kim et al.

(10) Patent No.: US 12,550,525 B2
(45) Date of Patent: Feb. 10, 2026

(54) DISPLAY DEVICE WITH OVERLAPPING FANOUTS

(71) Applicant: Samsung Display Co., Ltd., Yongin-Si (KR)

(72) Inventors: Eunhye Kim, Namyangju-si (KR); Kiho Bang, Hwaseong-si (KR); Eunae Jung, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 519 days.

(21) Appl. No.: 18/084,453

(22) Filed: Dec. 19, 2022

(65) Prior Publication Data

US 2023/0240092 A1   Jul. 27, 2023

(30) Foreign Application Priority Data

Jan. 24, 2022  (KR) .................. 10-2022-0010271

(51) Int. Cl.
*H10K 50/84*  (2023.01)
*H10K 59/122*  (2023.01)
*H10K 59/131*  (2023.01)
*H10K 59/80*  (2023.01)

(52) U.S. Cl.
CPC ........... *H10K 50/84* (2023.02); *H10K 59/122* (2023.02); *H10K 59/131* (2023.02); *H10K 59/871* (2023.02)

(58) Field of Classification Search
CPC .... H10K 50/84; H10K 59/131; H10K 59/122; H10K 59/871
USPC .............................................. 257/40, 59, 99
See application file for complete search history.

(56) References Cited

U.S. PATENT DOCUMENTS

| | | | | |
|---|---|---|---|---|
| 10,727,293 | B2* | 7/2020 | Jeong | H10K 59/131 |
| 11,158,267 | B2* | 10/2021 | Jeong | H10D 86/60 |
| 2016/0180790 | A1* | 6/2016 | Park | G09G 3/3677 345/92 |
| 2017/0323936 | A1* | 11/2017 | Lee | H10K 50/8445 |
| 2018/0033831 | A1 | 2/2018 | An et al. | |
| 2018/0102502 | A1* | 4/2018 | Kim | H10K 59/8731 |
| 2019/0165312 | A1* | 5/2019 | Bae | H10K 59/873 |
| 2020/0006452 | A1* | 1/2020 | Lee | H10K 59/1213 |

(Continued)

FOREIGN PATENT DOCUMENTS

| KR | 10-2020-0054150 A | 5/2020 |
|---|---|---|
| KR | 10-2020-0113065 A | 10/2020 |

*Primary Examiner* — Eric W Jones
(74) *Attorney, Agent, or Firm* — Innovation Counsel LLP

(57) ABSTRACT

Provided is a display device comprising a substrate including a display area, a first non-display area surrounding the display area, a second non-display area, and a third non-display area, a data line disposed on the substrate in the display area, a dam disposed on the substrate in the first non-display area and including an organic material, a bank disposed on the substrate in the third non-display area and spaced apart from the dam, a wiring part disposed on the substrate, overlapping the second non-display area, connected to the data line, and including first wirings extending in a first direction and second wirings extending in a second direction crossing the first direction and an inorganic film disposed on the substrate in the display area, the first non-display area, the second non-display area, and the third non-display area, and covering the dam, the bank, and the wiring part.

20 Claims, 12 Drawing Sheets

(56) References Cited

U.S. PATENT DOCUMENTS

2020/0006461 A1\* 1/2020 Cho ................... H10K 50/8445
2020/0301535 A1 9/2020 Choi et al.
2020/0381508 A1\* 12/2020 Jeon ....................... H10K 59/38
2020/0381653 A1\* 12/2020 Bang ................... H10K 59/122

\* cited by examiner

DISPLAY DEVICE WITH OVERLAPPING FANOUTS

CROSS-REFERENCE TO RELATED APPLICATION(S)

This application claims priority under 35 USC § 119 to Korean Patent Application No. 10-2022-0010271 filed on Jan. 24, 2022 in the Korean Intellectual Property Office (KIPO), the entire disclosure of which is incorporated by reference herein.

BACKGROUND

1. Field

The present disclosure generally relates to a display device. More particularly, the present disclosure relates to a display device capable of preventing shrinkage of a display panel due to moisture permeation.

2. Description of the Related Art

The display device is a device that displays an image for providing visual information to a user. The display device may include a display area and a non-display area.

A light emitting diode emitting light and a transistor driving the light emitting diode may be disposed in the display area. Drivers for driving the transistor and the light emitting diode may be disposed in the non-display area. Wirings connecting the drivers and the transistor may be disposed in the non-display area.

SUMMARY

Embodiments provide a display device which prevents shrinkage of a display panel due to moisture permeation.

A display device according to an embodiment may include a substrate including a display area, a first non-display area surrounding the display area, a second non-display area spaced apart from the display area and adjacent to the first non-display area, and a third non-display area spaced apart from the first non-display area and adjacent to the second non-display area, a data line disposed on the substrate in the display area, a dam disposed on the substrate in the first non-display area and including an organic material, a bank disposed on the substrate in the third non-display area and spaced apart from the dam, a wiring part disposed on the substrate, overlapping the second non-display area, connected to the data line, and including first wirings extending in a first direction and second wirings extending in a second direction crossing the first direction and an inorganic film disposed on the substrate in the display area, the first non-display area, the second non-display area, and the third non-display area, and covering the dam, the bank, and the wiring part.

In an embodiment, the first wirings and the second wirings may cross each other in the second non-display area.

In an embodiment, the first wirings may be disposed on a different layer from the second wirings.

In an embodiment, the first direction may be a linear direction from the bank to the dam, and the second direction may be a direction obliquely crossing the first direction or a direction orthogonal to the first direction.

In an embodiment, an upper surface portion of the inorganic film overlapping the wiring part in the second non-display area may protrude along a profile of an upper surface of the wiring part.

In an embodiment, the dam may include an organic layer extending from the display area.

In an embodiment, the display device may further include a transistor disposed in the display area and including an active layer disposed on the substrate, a gate electrode disposed on the active layer, and a source electrode and a drain electrode disposed on the gate electrode.

In an embodiment, the display device may further include an upper electrode disposed on the gate electrode.

In an embodiment, each of the first wirings may be disposed on the same layer as the gate electrode.

In an embodiment, each of the second wirings may be disposed on the same layer as the upper electrode.

In an embodiment, the display device may further include a pad disposed in the third non-display area.

In an embodiment, each of the wiring part may be connected to the pad.

A display device according to an embodiment may include a substrate including a display area, a first non-display area surrounding the display area, a second non-display area spaced apart from the display area and adjacent to the first non-display area, and a third non-display area spaced apart from the first non-display area and adjacent to the second non-display area, a data line disposed on the substrate in the display area, a dam disposed on the substrate in the first non-display area and including an organic material, a bank disposed on the substrate in the third non-display area and spaced apart from the dam, a wiring part disposed on the substrate, overlapping the second non-display area, connected to the data line, and including first wirings extending in a direction crossing a vertical direction from the bank to the dam and second wirings extending in the direction, a dummy pattern part disposed on the substrate in the second non-display area and spaced apart from the wiring part and an inorganic film disposed on the substrate in the display area, the first non-display area, the second non-display area, and the third non-display area, and covering the dam, the bank, and the wiring part.

In an embodiment, an upper surface of a portion of the inorganic film overlapping each of the wiring part and the dummy pattern part in the second non-display area may protrude along a profile of an upper surface of each of the wiring part and the dummy pattern part.

In an embodiment, the dummy pattern part may include first dummy patterns and second dummy patterns disposed on a different layer from the first dummy patterns, the first dummy patterns may be disposed on the same layer as the first wirings, and the second dummy patterns may be disposed on the same layer as the second wirings.

In an embodiment, the first dummy patterns may extend in a direction obliquely crossing the vertical direction or in a direction orthogonal to the vertical direction, and the second dummy patterns may be disposed in parallel with the first dummy patterns and may not overlap the first dummy patterns.

In an embodiment, the first dummy patterns and the second dummy patterns may cross each other in a plan view.

In an embodiment, the display device may further include a transistor disposed in the display area and including an active layer disposed on the substrate, a gate electrode disposed on the active layer, and a source electrode and a drain electrode disposed on the gate electrode and an upper electrode disposed on the gate electrode.

In an embodiment, each of the first dummy patterns may be disposed on the same layer as the gate electrode, and each of the second dummy patterns may be disposed on the same layer as the upper electrode.

In an embodiment, each of the first dummy patterns and the second dummy patterns may have an island shape.

In a display device according to embodiments of the present disclosure, in the non-display area, since the first wirings and the second wirings cross each other, an organic residual layer may not remain in the non-display area. Since the dummy pattern part is disposed in a portion of the non-display area where the wirings are not disposed, the organic residual layer may not remain in the non-display area as a whole. Accordingly, moisture permeation through the organic residual layer in the non-display area may be prevented. Accordingly, shrinkage of the display panel of the display device due to the moisture permeation may be prevented.

DETAILED DESCRIPTION OF THE EMBODIMENTS

Figure 1:
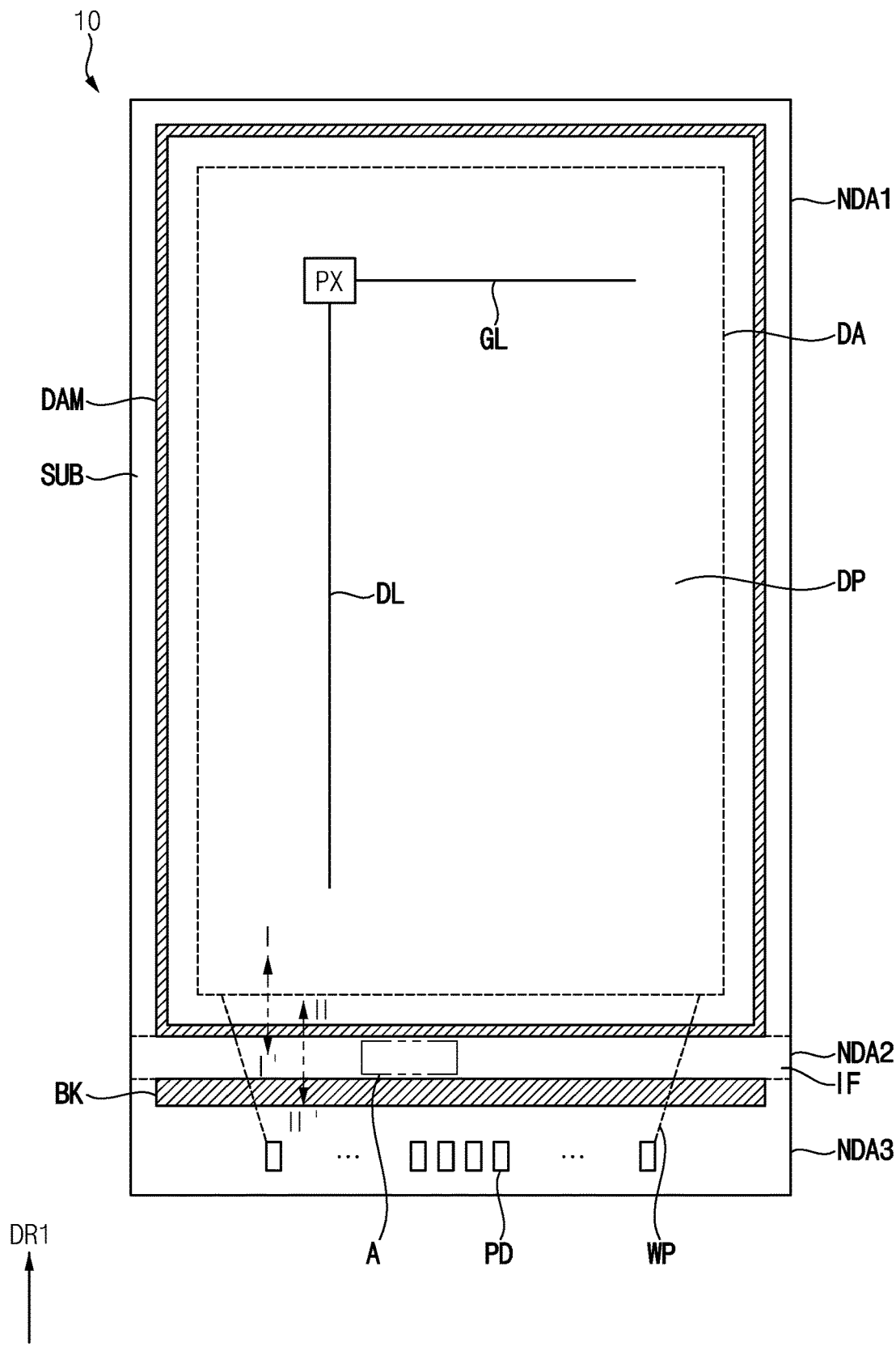
FIG. 1 is a plan view of a display device according to an embodiment.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view of a display device according to an embodiment.

Referring to FIG. 1, a display device 10 may include a substrate SUB. The substrate SUB may include a display area DA, a first non-display area NDA1, a second non-display area NDA2, and a third non-display area NDA3. The display area DA may be an area for displaying a screen. The first non-display area NDA1 may surround the display area DA. The second non-display area NDA2 may be adjacent to the first non-display area NDA1. The second non-display area NDA2 may be spaced apart from the display area DA. The third non-display area NDA3 may be adjacent to the second non-display area NDA2. The third non-display area NDA3 may be spaced apart from the first non-display area NDA1. The first non-display area NDA1, the second non-display area NDA2, and the third non-display area NDA3 may be areas that do not display a screen.

Pixels PX may be disposed in the display area DA. The pixels PX may emit light to display a screen. In addition, wirings connected to the pixels PX and transmitting signals to the pixels PX may be disposed in the display area DA. For example, the wirings may include data lines DL transmitting a data signal and gate lines GL transmitting a gate signal.

A dam DAM may be disposed on the substrate SUB in the first non-display area NDA1. At least one dam DAM may be disposed in the first non-display area NDA1. For example, one dam DAM or two or more dams DAM may be disposed in the first non-display area NDA1.

The dam DAM may be disposed outside the display area DA. The dam DAM may surround the display area DA. The dam DAM may confine the organic encapsulation layer (e.g., the organic encapsulation layer OEL of FIG. 2) in the display area DA. That is, the dam DAM may prevent the organic encapsulation layer from overflowing into the second non-display area NDA2 and the third non-display area NDA3.

A bank BK may be disposed on the substrate SUB in the third non-display area NDA3. The bank BK may be spaced apart from the dam DAM and disposed outside the dam DAM. The bank BK may support a mask disposed on the display device 10 during a manufacturing process of the display device 10. The mask may not directly contact the display panel DP included in the display device 10 due to the bank BK.

A pad PD may be disposed on the substrate SUB in the third non-display area NDA3. At least one pad PD may be disposed in the third non-display area NDA3.

The pad PD may be connected to the wirings disposed in the display area DA. The pad PD may receive an external signal and transmit the external signal to the pixels PX through the wirings.

A wiring part WP may be disposed on the substrate SUB. The wiring part WP may be connected to the data line DL in the display area DA. The wiring part WP may be connected to the pad PD in the third non-display area NDA3. The wiring part WP may be disposed in the second non-display area NDA2.

The wiring part WP may overlap the dam DAM in the first non-display area NDA1, and the wiring part WP may overlap the bank BK in the third non-display area NDA3.

Figure 2:
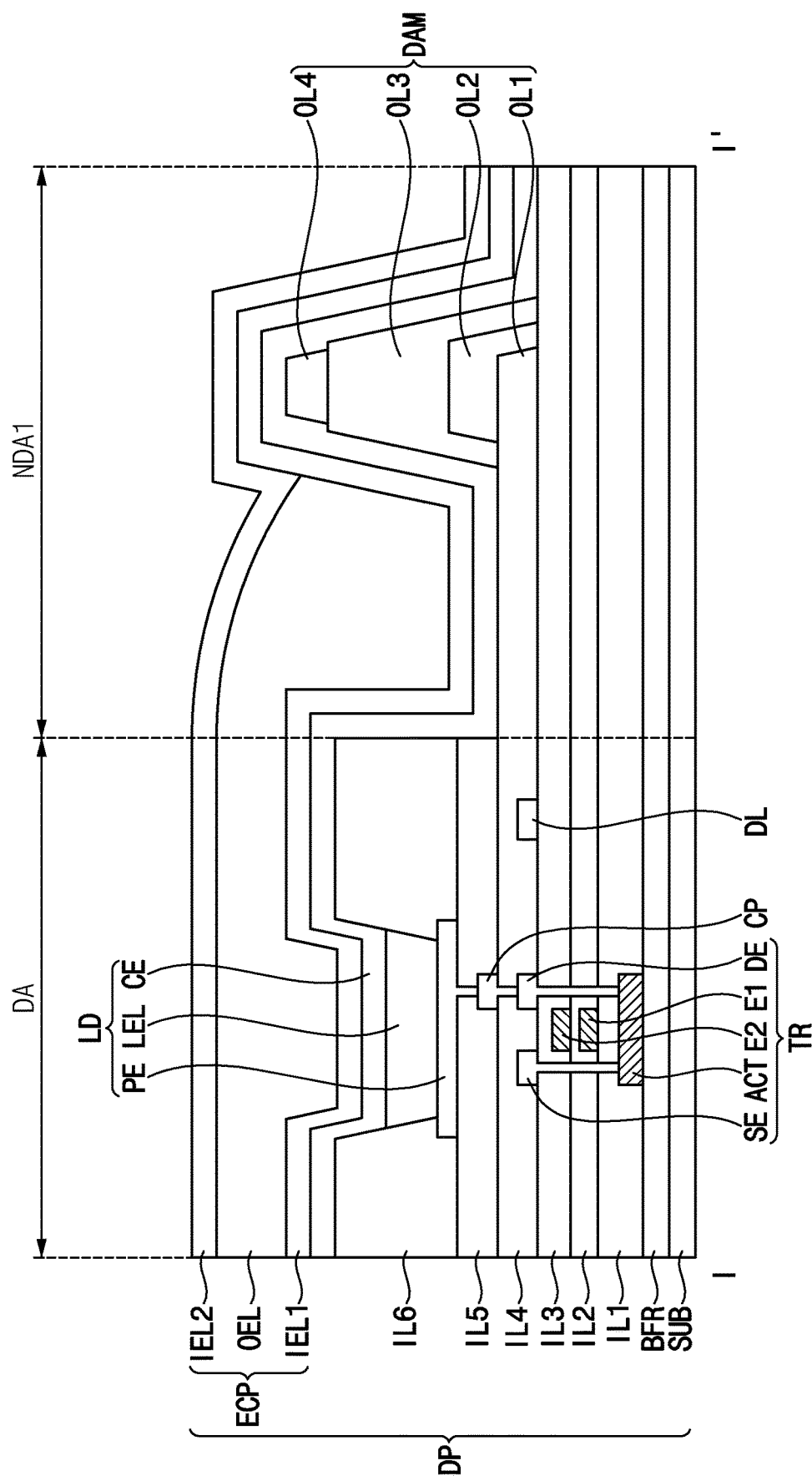
FIG. 2 is a cross-sectional view taken along line I-I' of FIG. 1.

FIG. 2 is a cross-sectional view taken along line I-I' of FIG. 1.

Referring to FIGS. 1 and 2, the display device 10 may include a display panel DP. In the display area DA, the display panel DP may include the substrate SUB, a buffer layer BFR, insulation layers, a transistor TR, the data line DL, a connection pattern CP, and a light emitting diode LD, and an encapsulation layer ECP.

The buffer layer BFR may be disposed on the substrate SUB. The buffer layer BFR may be disposed in the display area DA, the first non-display area NDA1, the second non-display area NDA2, and the third non-display area NDA3. The buffer layer BFR may prevent diffusion of metal atoms or impurities from the substrate SUB to the active layer ACT.

The transistor TR may be disposed on the substrate SUB in the display area DA. The transistor TR may include an active layer ACT, a gate electrode E1, a source electrode SE, and a drain electrode DE.

In the display area DA, the active layer ACT may be disposed on the buffer layer BFR. The active layer ACT may be divided into a source region and a drain region doped with impurities, and a channel region between the source region and the drain region.

A first insulation layer IL1 may be disposed on the buffer layer BFR. The first insulation layer IL1 may cover the active layer ACT in the display area DA, and may be formed to have substantially the same thickness along a profile of the active layer ACT. However, embodiments according to the present disclosure are not limited thereto. In an embodiment, the first insulation layer IL1 may include an inorganic material. The first insulation layer IL1 may be disposed from the display area DA to the third non-display area NDA3. That is, the first insulation layer IL1 may be entirely disposed in the display area DA, the first non-display area NDA1, the second non-display area NDA2, and the third non-display area NDA3.

In the display area DA, the gate electrode E1 may be disposed on the first insulation layer IL1. The gate electrode E1 may overlap the channel region of the active layer ACT.

A second insulation layer IL2 may be disposed on the first insulation layer IL1. In addition, the second insulation layer IL2 may cover the gate electrode E1 and may be disposed to have substantially the same thickness along a profile of the gate electrode E1. However, embodiments according to the present disclosure are not limited thereto. In an embodiment, the second insulation layer IL2 may include an inorganic material. The second insulation layer IL2 may be disposed from the display area DA to the third non-display area NDA3.

In the display area DA, an upper electrode E2 may be disposed on the second insulation layer IL2. The upper electrode E2 may be a capacitor electrode. The upper electrode E2 and the gate electrode E1 may constitute a capacitor.

A third insulation layer IL3 may be disposed on the second insulation layer IL2. In addition, the third insulation layer IL3 may cover the upper electrode E2 and may be disposed to have substantially the same thickness along a profile of the upper electrode E2. However, the present disclosure is not limited thereto. In an embodiment, the third insulation layer IL3 may include an inorganic material. The third insulation layer IL3 may be disposed entirely from the display area DA to the third non-display area NDA3.

In the display area DA, the source electrode SE and the drain electrode DE may be disposed on the third insulation layer IL3. The source electrode SE may contact the source region of the active layer ACT via a first contact hole penetrated through the first to third insulation layers IL1, IL2, and IL3. The drain electrode DE may contact the drain region of the active layer ACT via a second contact hole penetrated through the first to third insulation layers IL1, IL2, and IL3.

The data line DL may be disposed on the third insulation layer IL3. The data line DL may be connected to the transistor TR. The data line DL may transmit the data signal to the transistor TR.

In the display area DA, a fourth insulation layer IL4 may be disposed on the third insulation layer IL3. In addition, the fourth insulation layer IL4 may cover the source electrode SE, the drain electrode DE, and the data line DL, and the source electrode SE, the drain electrode DE, and may have a substantially flat upper surface without creating a step around the source electrode SE, the drain electrode DE, and the data line DL. However, the present disclosure is not limited thereto. In an embodiment, the fourth insulation layer IL4 may include an organic material. The fourth insulation layer IL4 may be disposed from the display area DA to the third non-display area NDA3.

In the display area DA, the connection pattern CP may be disposed on the fourth insulation layer IL4. The connection pattern CP may contact the drain electrode DE or the source electrode SE through a third contact hole formed in the fourth insulation layer IL4.

In the display area DA, a fifth insulation layer IL5 may be disposed on the fourth insulation layer IL4. The fifth insulation layer IL5 may cover the connection pattern CP, and may have a substantially flat upper surface without creating a step around the connection pattern CP. However, the present disclosure is not limited thereto. In an embodiment, the fourth insulation layer IL4 may include an organic material.

In the display area DA, the light emitting diode LD may be disposed on the fifth insulation layer IL5. The light emitting diode LD may include a pixel electrode PE, a light emitting layer LEL, and a common electrode CE. The pixel electrode PE may have reflective or transmissive properties. For example, the pixel electrode PE may include a metal.

The pixel electrode PE may contact the connection pattern CP via a fourth contact hole penetrated through the fifth insulation layer. Through this, the pixel electrode PE may be connected to the transistor TR.

In the display area DA, a sixth insulation layer IL6 may be disposed on the fifth insulation layer IL5. An opening exposing an upper surface of the pixel electrode PE may be defined in the sixth insulation layer IL6. For example, the sixth insulation layer IL6 may include an organic material.

In the display area DA, a spacer may be disposed on the sixth insulation layer IL6. For example, the spacer may include an organic material. The spacer may maintain a gap between the encapsulation layer ECP and the substrate SUB.

The light emitting layer LEL may be disposed on the pixel electrode PE. The light emitting layer LEL may be disposed in the opening formed in the sixth insulation layer IL6. In an embodiment, the light emitting layer LEL may have a multilayer structure including a hole injection layer, a hole transport layer, an organic emission layer, an electron transport layer, and an electron injection layer. The organic light emitting layer may include a light emitting material.

The common electrode CE may cover the light emitting layer LEL, and may be disposed on the sixth insulation layer IL6. In an embodiment, the common electrode CE may have a plate shape. Also, the common electrode CE may have transmissive or reflective properties. For example, the common electrode CE may include a metal. The common electrode CE may extend from the display area DA to the third non-display area NDA3.

The encapsulation layer ECP may prevent moisture and oxygen from penetrating into the light emitting diode LD from the outside. For example, the encapsulation layer ECP may include a first inorganic encapsulation layer IEL1, an organic encapsulation layer OEL, and a second inorganic encapsulation layer IEL2.

The first inorganic encapsulation layer IEL1 may be disposed on the common electrode CE to have substantially the same thickness along a profile of the common electrode CE. The organic encapsulation layer OEL may be disposed on the first inorganic encapsulation layer IEL1, and may have a substantially flat upper surface without creating a step around the first inorganic encapsulation layer IEL1. The second inorganic encapsulation layer IEL2 may be disposed on the organic encapsulation layer OEL.

The organic encapsulation layer OEL may be disposed in the display area DA and a portion of the first non-display area NDA1. The first inorganic encapsulation layer IEL1 and the second inorganic encapsulation layer IEL2 may extend from the display area DA to the third non-display area NDA3.

In the first non-display area NDA1, the dam DAM may be disposed on the third insulation layer IL3. The dam DAM may include an organic material. The dam DAM may have a single-layer structure or a multi-layer structure.

For example, the dam DAM may have a multilayer structure and may include a first organic layer OL1, a second organic layer OL2, a third organic layer OL3, and a fourth organic layer OL4.

The first organic layer OL1 may extend from the display area DA. The first organic layer OL1 may be connected to the fourth insulation layer IL4 disposed in the display area DA. That is, the first organic layer OL1 may be integrally formed with the fourth insulation layer IL4 of the display area DA. However, embodiments according to the present disclosure are not limited thereto.

The second organic layer OL2 may be disposed on the first organic layer OL1 and partially on the third insulation layer IL3, and the second organic layer OL2 may be disposed on the same layer as the fifth insulation layer IL5 disposed in the display area DA and may include the same material as the fifth insulation layer IL5. However, the present disclosure is not limited thereto. In a plan view, the second organic layer OL2 may be spaced apart from the fifth insulation layer IL5.

The third organic layer OL3 may be disposed on the second organic layer OL2 and partially on the first organic layer OL1 the third insulation layer IL3. The third organic layer OL3 may be disposed on the same layer as the sixth insulation layer IL6 disposed in the display area DA, and may include the same material as the sixth insulation layer IL6. However, the present disclosure is not limited thereto. In a plan view, the third organic layer OL3 may be spaced apart from the sixth insulation layer IL6.

The fourth organic layer OL4 may be disposed on the third organic layer OL3. That is, the entirety of the fourth organic layer OL4 may be disposed on the third organic layer OL3. The fourth organic layer OL4 may be disposed on the same layer as the spacer disposed in the display area DA, and may include the same material as the spacer.

Figure 3:
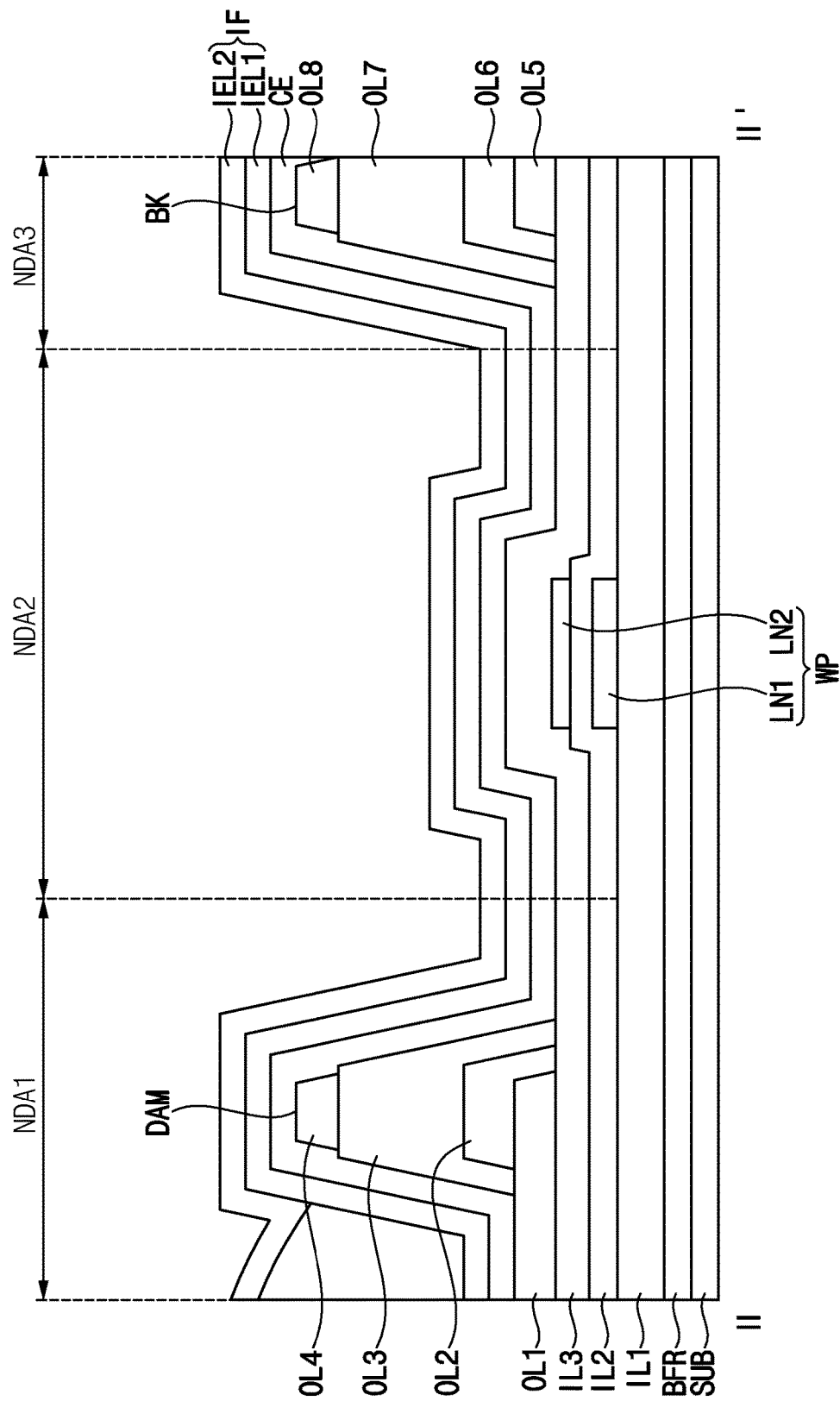
FIG. 3 is a cross-sectional view taken along the line II-II' of FIG. 1.

FIG. 3 is a cross-sectional view taken along the line II-II' of FIG. 1.

Referring to FIGS. 1, 2, and 3, in the third non-display area NDA3, the bank BK may be disposed on the third insulation layer IL3. The bank BK may include an organic material. The bank BK may be spaced apart from the dam DAM with respect to the second non-display area NDA2. The bank BK may not be connected to the fourth to sixth insulation layers IL4, IL5, and IL6 disposed in the display area DA and the dam DAM. The bank BK may have a single layer structure or a multi-layer structure.

For example, the bank BK may have a multilayer structure and may include a fifth organic layer OL5, a sixth organic layer OL6, a seventh organic layer OL7, and an eighth organic layer OL8.

The fifth organic layer OL5 may be spaced apart from the first organic layer OL1 disposed in the first non-display area NDA1, may be disposed on the same layer as the fourth insulation layer IL4 and the first organic layer OL1 and may include the same material as the fourth insulation layer IL4 and the first organic layer OL1. That is, the fifth organic layer OL5 may be disposed on the third insulation layer IL3. However, the present disclosure is not limited thereto.

The sixth organic layer OL6 may be disposed on the fifth organic layer OL5 and partially on the third insulation layer IL3, and the sixth organic layer OL6 may be disposed on the same layer as the fifth insulation layer IL5 in the display area DA and the second organic layer OL2 in the first non-display area NDA1. The sixth organic layer OL6 may include the same material as the fifth insulation layer IL5 and the second organic layer OL2. However, the present disclosure is not limited thereto. In a plan view, the sixth organic layer OL6 may be spaced apart from the second organic layer OL2.

The seventh organic layer OL7 may be disposed on the sixth organic layer OL6 and partially on the third insulation layer IL3. The seventh organic layer OL7 may be disposed on the same layer as the sixth insulation layer IL6 in the display area DA and the third organic layer OL3 in the first non-display area NDA1. In addition, the seventh organic layer OL7 may include the same material as the sixth insulation layer IL6 and the third organic layer OL3. However, the present disclosure is not limited thereto. In a plan view, the seventh organic layer OL7 may be spaced apart from the third organic layer OL3.

The eighth organic layer OL8 may be disposed on the seventh organic layer OL7. The eighth organic layer OL8 may be disposed on the same layer as the spacer in the display area DA and the fourth insulation layer IL4 in the first non-display area NDA1. In addition, the eighth organic layer OL8 may include the same material as the spacer and the fourth organic layer OL4.

Accordingly, since the bank BK includes the organic layers including the same material as the dam DAM, the dam DAM and the bank BK may include the same material. However, the present disclosure is not limited thereto, and the dam DAM and the bank BK may include different materials and may have different structures.

The second non-display area NDA2 may be positioned between the first non-display area NDA1 and the third non-display area NDA3. In the second non-display area NDA2, the wiring part WP may be disposed. The wiring part WP may be connected to the data line DL in the first non-display area NDA1 and may be connected to the pad PD in the third non-display area NDA3.

In an embodiment, the wiring part WP may include the first wirings LN1 and second wirings LN2. The first wirings LN1 may be disposed on the same layer each other, and each of the first wiring LN1 may be disposed on the first insulation layer IL1. The second wirings LN2 may be disposed on the same layer each other, and each of the second wirings LN2 may be disposed on the second insulation layer IL2. The first wirings LN1 and the second wirings LN2 may be disposed on different layers from each other. The first wirings LN1 may be disposed on the same layer each other. The second wirings LN2 may be disposed on the same layer each other The first wirings LN1 may be connected to the data line DL in the first non-display area NDA1 and may be connected to the pad PD in the third non-display area NDA3. Similarly, the second wirings LN2 may be connected to the data line DL in the first non-display area NDA1 and may be connected to the pad PD in the third non-display area NDA3. For example, the first wirings LN1 and the second wirings LN2 may be fan-out wirings.

In the first non-display area NDA1, the second non-display area NDA2, and the third non-display area NDA3, the common electrode CE may be disposed on the dam DAM, the wiring part WP, and the bank BK in order to cover the dam DAM, the wiring part WP, and the bank BK respectively. In addition, in the first non-display area NDA1, the second non-display area NDA2, and the third non-display area NDA3, the first inorganic encapsulation layer IEL1 and the second inorganic encapsulation layer IEL2 may be disposed on the common electrode CE. The first inorganic encapsulation layer IEL1 and the second inorganic encapsulation layer IEL2 may constitute an inorganic film IF. The inorganic film IF may cover the dam DAM, the wiring part WP, and the bank BK. That is, the inorganic film IF may extend from the display area DA to the third non-display area NDA3.

As depicted in FIG. 2, the organic encapsulation layer OEL may be confined by the dam DAM in the first non-display area NDA1. The organic encapsulation layer OEL may not overflow to another area due to the dam DAM.

In the display area DA, the first non-display area NDA1, the second non-display area NDA2, and the third non-display area NDA3, the inorganic film IF may protrude along a profile of the upper surface of another overlapping member.

For example, in the second non-display area NDA2, the inorganic film IF may overlap the wiring part WP. The upper surface of a portion of the inorganic film IF overlapping the wiring part WP may protrude along a profile of the upper surface of the wiring part WP.

Figure 4:
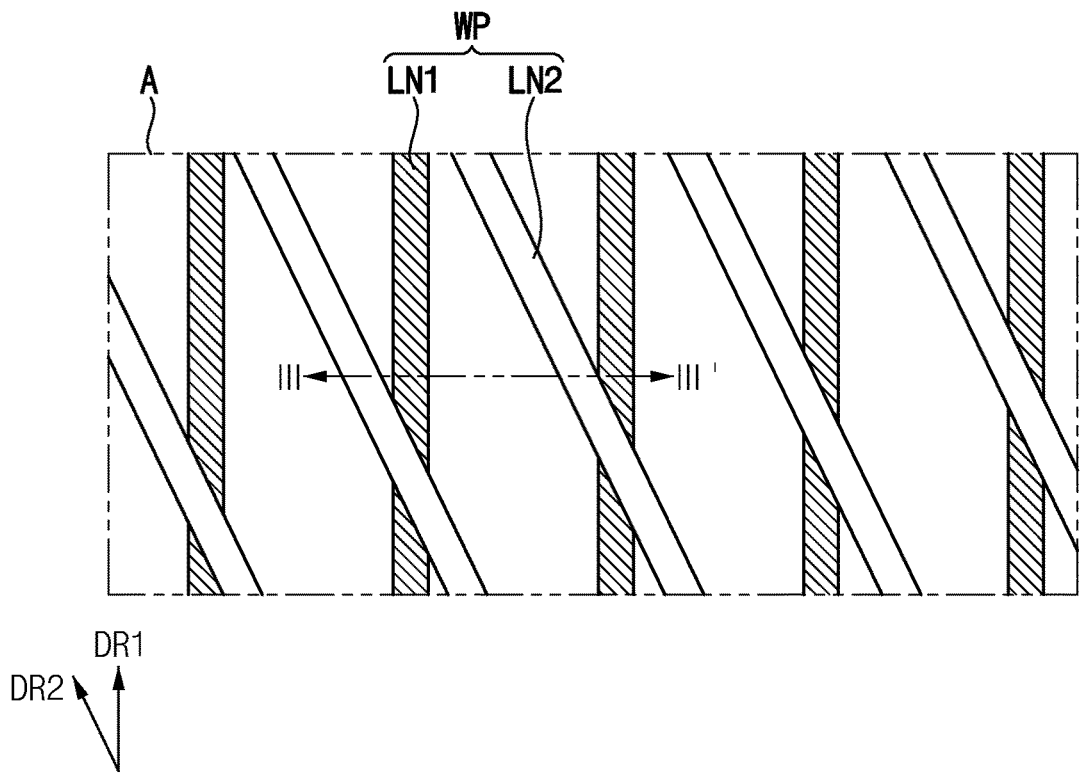
FIG. 4 is an enlarged plan view of area A of FIG. 1.
Figure 5:
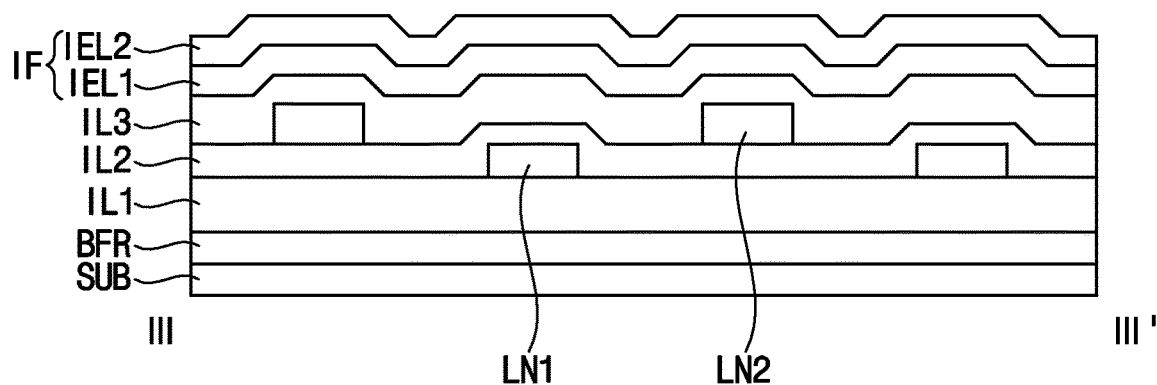
FIG. 5 is a cross-sectional view taken along line III-III' of FIG. 4.
Figure 6:
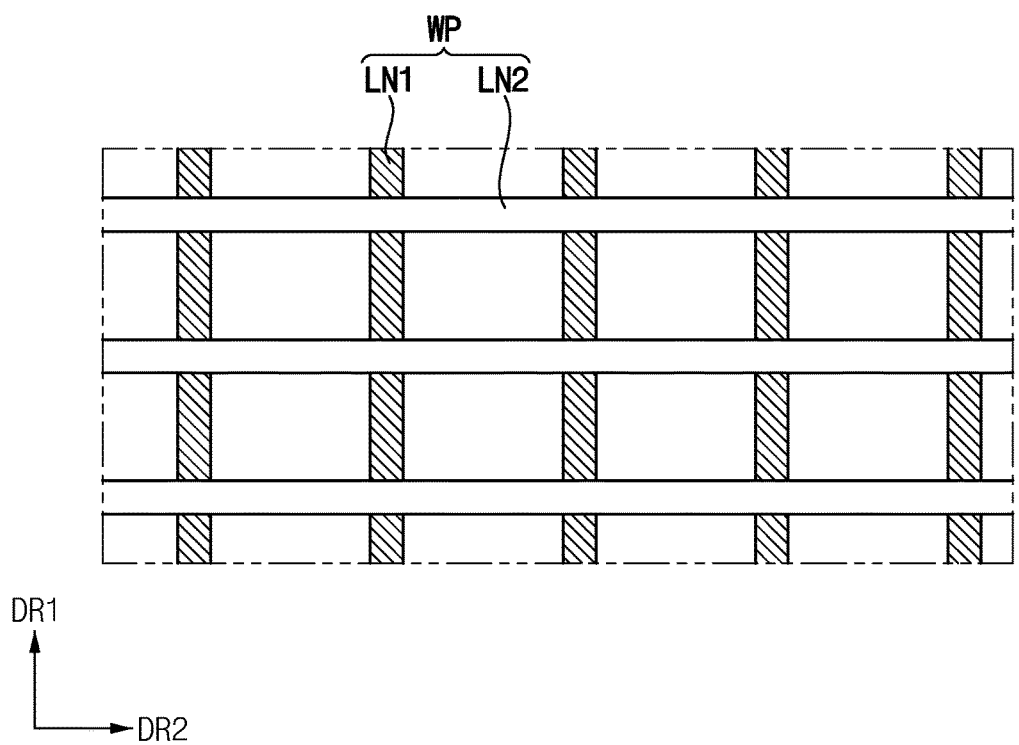
FIG. 6 is a plan view illustrating another example of FIG. 4.

FIG. 4 is an enlarged plan view of area A of FIG. 1. FIG. 5 is a cross-sectional view taken along line III-III' of FIG. 4. FIG. 6 is a plan view illustrating another example of FIG. 4.

Referring to FIGS. 2, 3, 4, and 5, the first wirings LN1 may extend in a first direction DR1. The second wirings LN2 may be disposed on the first wirings LN1, and the second wirings LN2 may extend in a second direction DR2 crossing the first direction DR1. Accordingly, the first wirings LN1 and the second wirings LN2 may cross each other in the second non-display area NDA2.

The first wirings LN1 may be disposed on the first insulation layer IL1. The first wirings LN1 may be disposed on the same layer as the gate electrode E1. The second wirings LN2 may be disposed on the second insulation layer IL2. The second wirings LN2 may be disposed on the same layer as the upper electrode E2.

Referring to FIGS. 4 and 6, for example, the first direction DR1 may mean a linear direction from the bank BK to the dam DAM. For example, the second direction DR2 may be a direction obliquely crossing the first direction DR1 (refer to FIG. 4). Alternatively, the second direction DR2 may be a direction orthogonal to the first direction DR1 (refer to FIG. 6). However, embodiments according to the present disclosure are not limited thereto.

In an embodiment, in the second non-display area NDA2, since the first wirings LN1 and the second wirings LN2 cross each other, an organic residual layer may not remain in the second non-display area NDA2. As a surface of the inorganic film IF partially protrudes due to the first wirings LN1 and the second wirings LN2, the organic residual layer may not remain in the second non-display area NDA2. Accordingly, moisture permeation through the organic residual layer in the second non-display area NDA2 may be prevented. Since the display device 10 has a structure in which the first wirings LN1 and the second wirings LN2 cross each other, shrinkage of the display panel (display panel DP of FIG. 2) due to the moisture permeation may be prevented.

Figure 7:
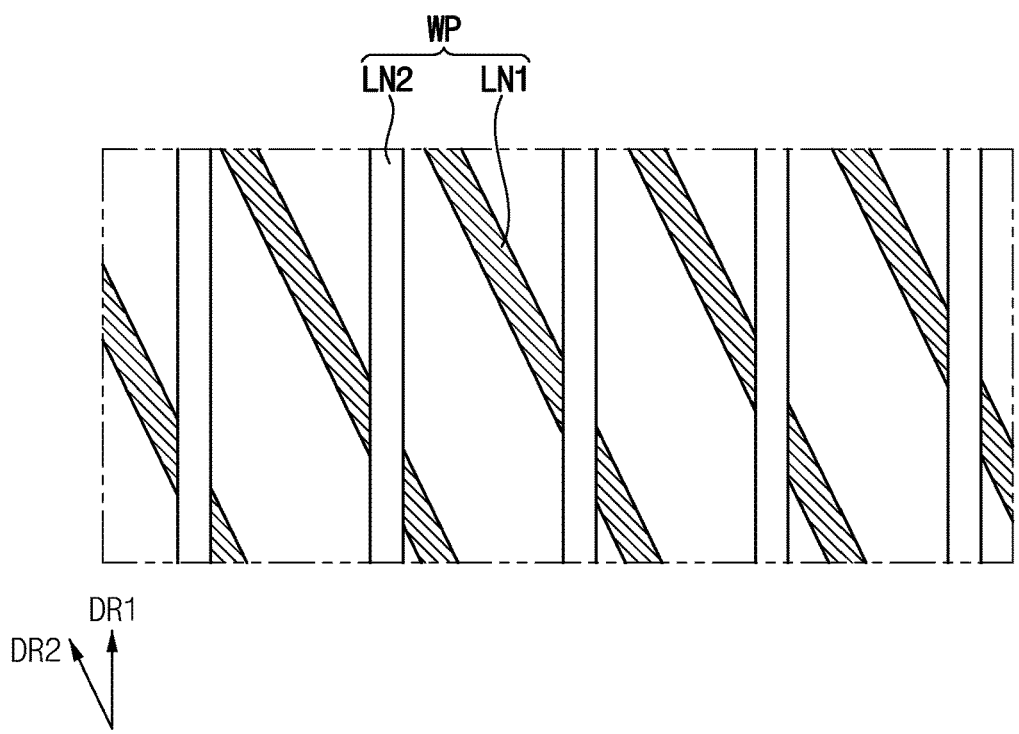
FIGS. 7 and 8 are plan views illustrating other examples of FIG. 4.
Figure 8:
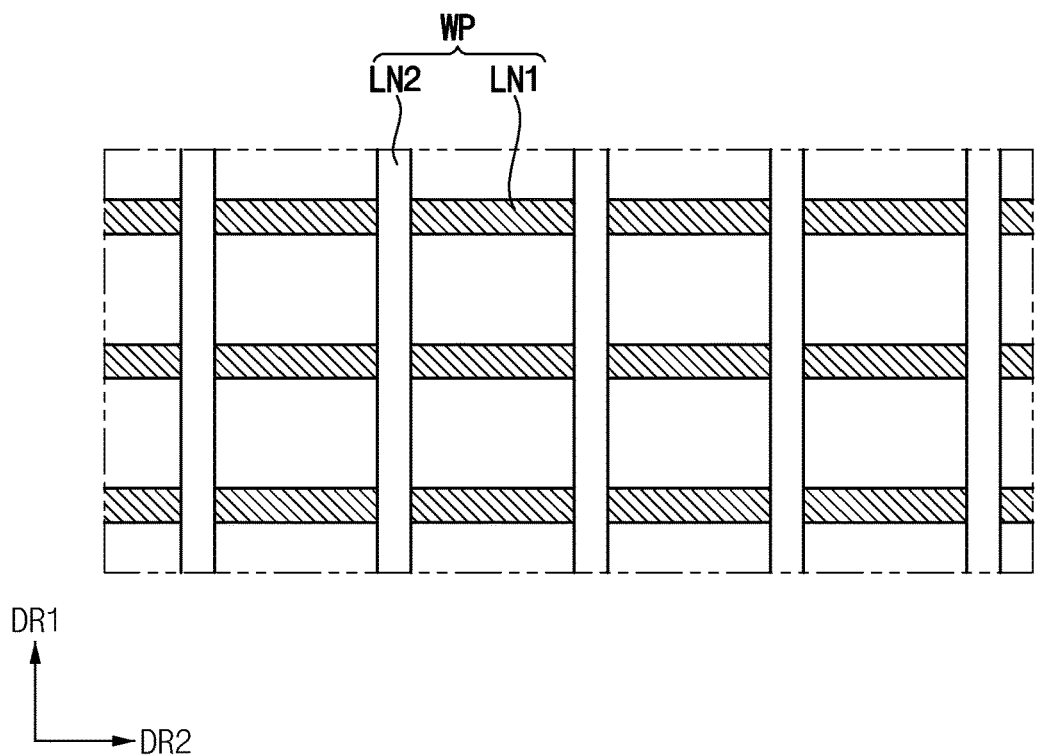

FIGS. 7 and 8 are plan views illustrating other examples of FIG. 4.

First wirings LN1 and second wirings LN2 according to FIGS. 7 and 8 may be the same as the first wirings LN1 and the second wirings LN2 of FIGS. 4 and 6 except for the arrangement relation of the first wirings LN1 and the second wirings LN2. Therefore, overlapping descriptions may be omitted.

Referring to FIGS. 7 and 8, the first wirings LN1 may extend in the second direction DR2. The second wirings LN2 may be disposed on the first wirings LN1, and the second wirings LN2 may extend in the first direction DR1 crossing the second direction DR2. Accordingly, the first wirings LN1 and the second wirings LN2 may cross each other in the second non-display area NDA2.

For example, the first direction DR1 may mean a linear direction from the bank BK to the dam DAM. For example, the second direction DR2 may be a direction obliquely crossing the first direction DR1 (refer to FIG. 7). Alternatively, the second direction DR2 may be a direction orthogonal to the first direction DR1 (refer to FIG. 8). However, embodiments according to the present disclosure are not limited thereto.

Figure 9:
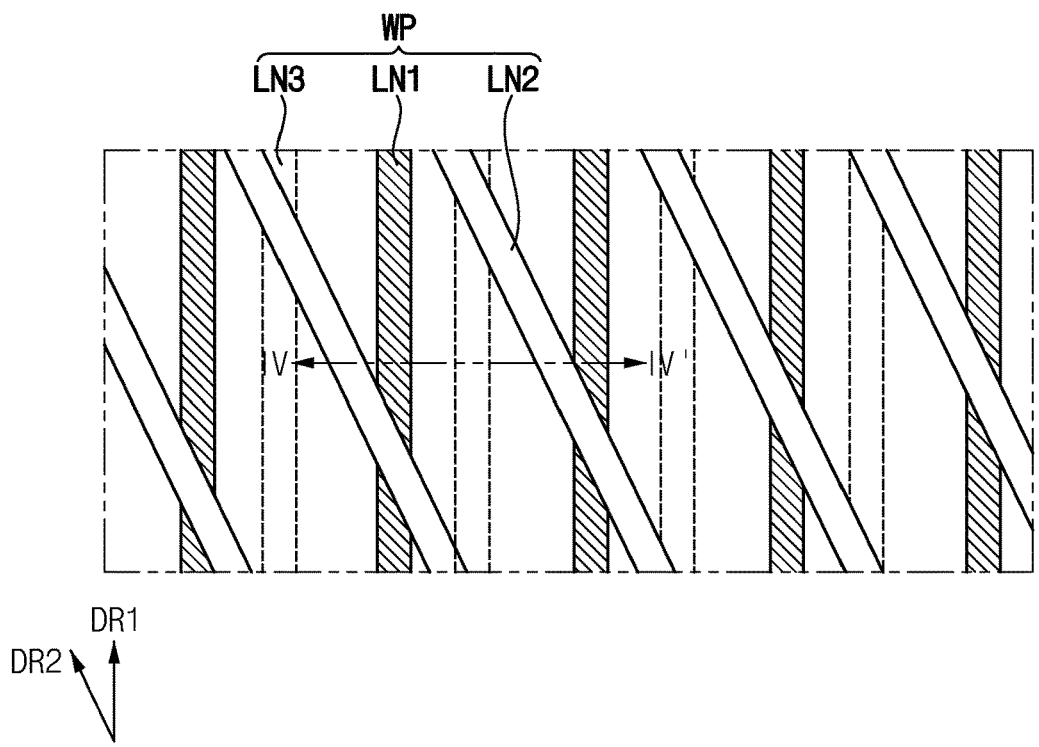
FIG. 9 is a plan view illustrating another example of FIG. 4.
Figure 10:
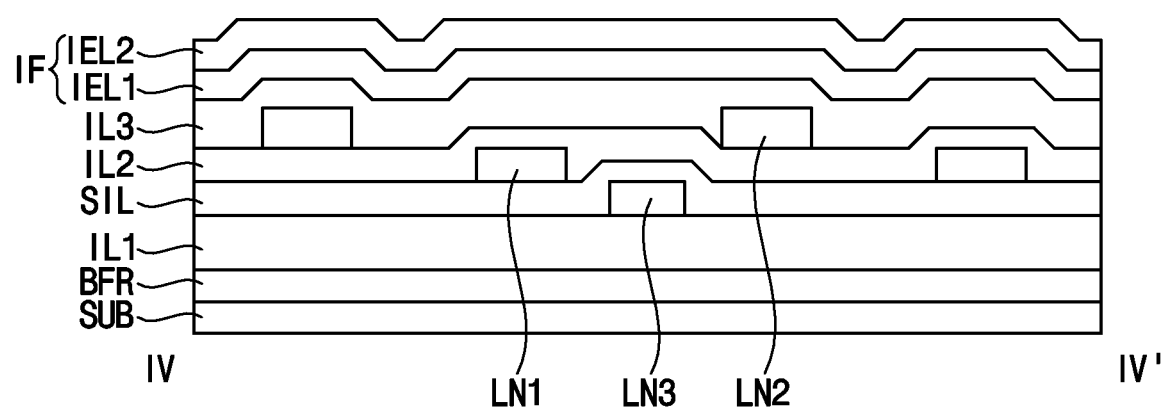
FIG. 10 is a cross-sectional view taken along line IV-IV' of FIG. 9.

FIG. 9 is a plan view illustrating another example of FIG. 4. FIG. 10 is a cross-sectional view taken along line IV-IV' of FIG. 9.

Referring to FIGS. 9 and 10, the wiring part WP may further include third wirings LN3. The third wirings LN3 may be disposed on a different layer from the first wirings LN1 and the second wirings LN2. For example, the third wirings LN3 may be disposed on the first insulation layer IL1. In addition, an additional sub insulation layer SIL may be disposed between the third wirings LN3 and the first wirings LN1. The sub insulation layer SIL may be entirely disposed in the display area, the first non-display area, the second non-display area, and the third non-display area (refer to FIG. 1). The sub insulation layer SIL may cover the third wirings LN3 and may be disposed on the first insulation layer IL1. The first wirings LN1 may be disposed on the sub insulation layer SIL.

However, the present disclosure is not limited thereto, and in another embodiment, the third wirings LN3 may be disposed on a higher layer than the first wirings LN1. In addition, in another embodiment, the third wirings LN3 may be disposed on a higher layer than the second wirings LN2.

The third wirings LN3 may extend in the first direction DR1 as shown in FIG. 9. However, the present disclosure is not limited thereto, and in other embodiments, the third wirings LN3 may extend in a direction obliquely crossing the first direction DR1 or in a direction orthogonal to the first direction DR1.

Figure 11:
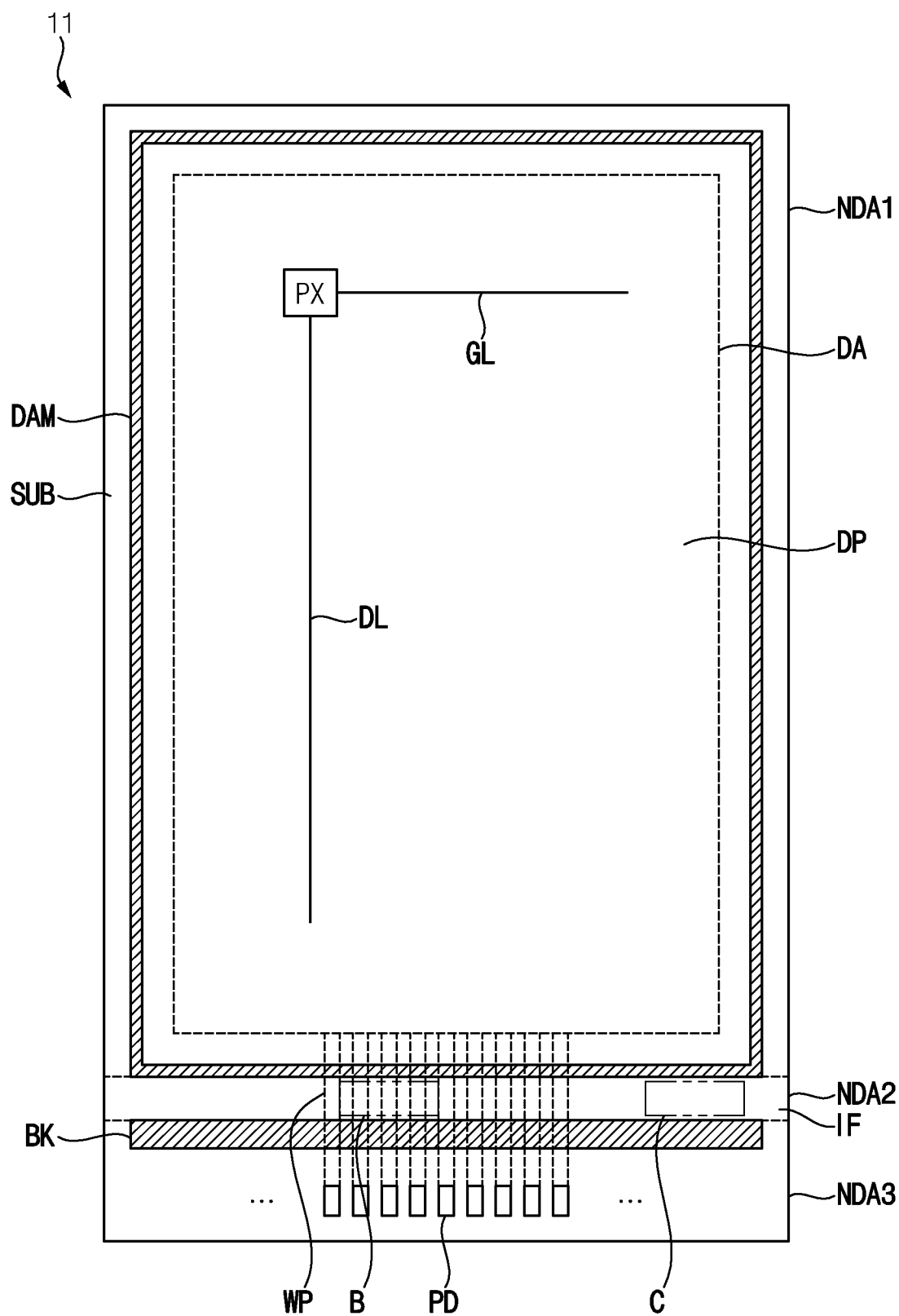
FIG. 11 is a plan view of a display device according to another embodiment.
Figure 12:
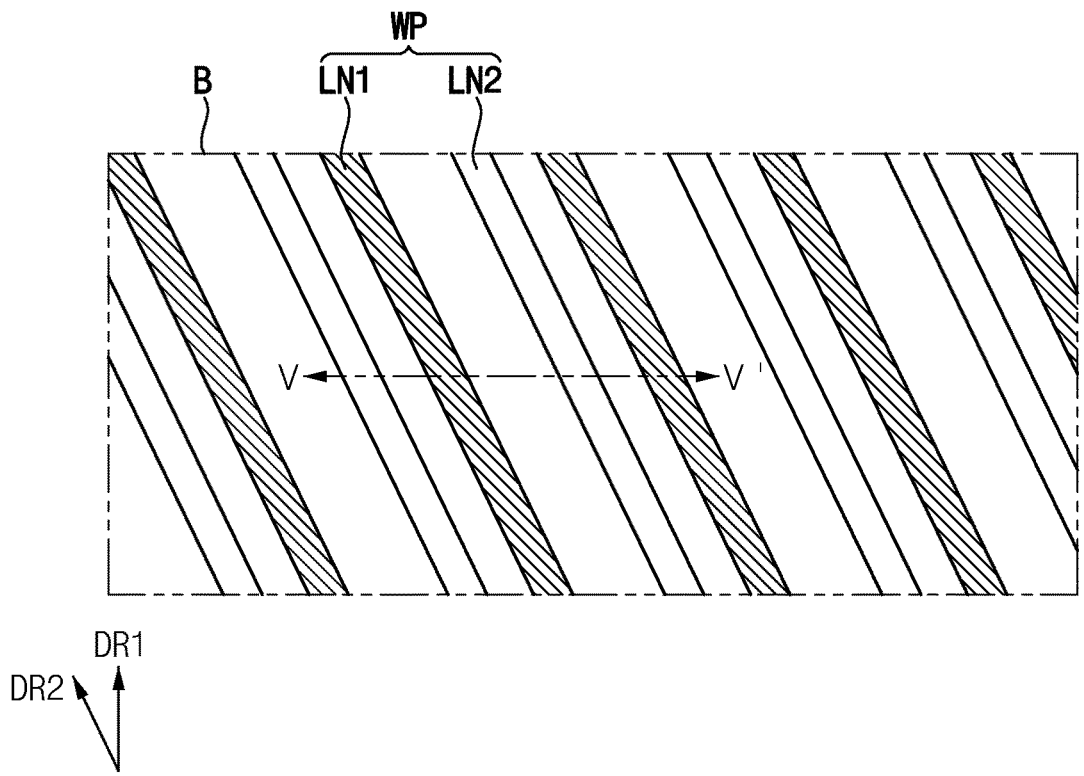
FIG. 12 is an enlarged plan view of area B of FIG. 11.
Figure 13:
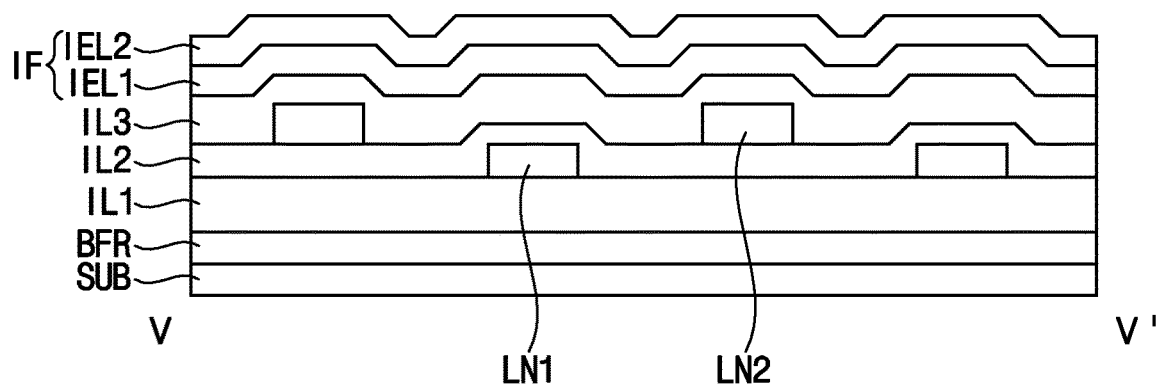
FIG. 13 is a cross-sectional view taken along line V-V' of FIG. 12.
Figure 14:
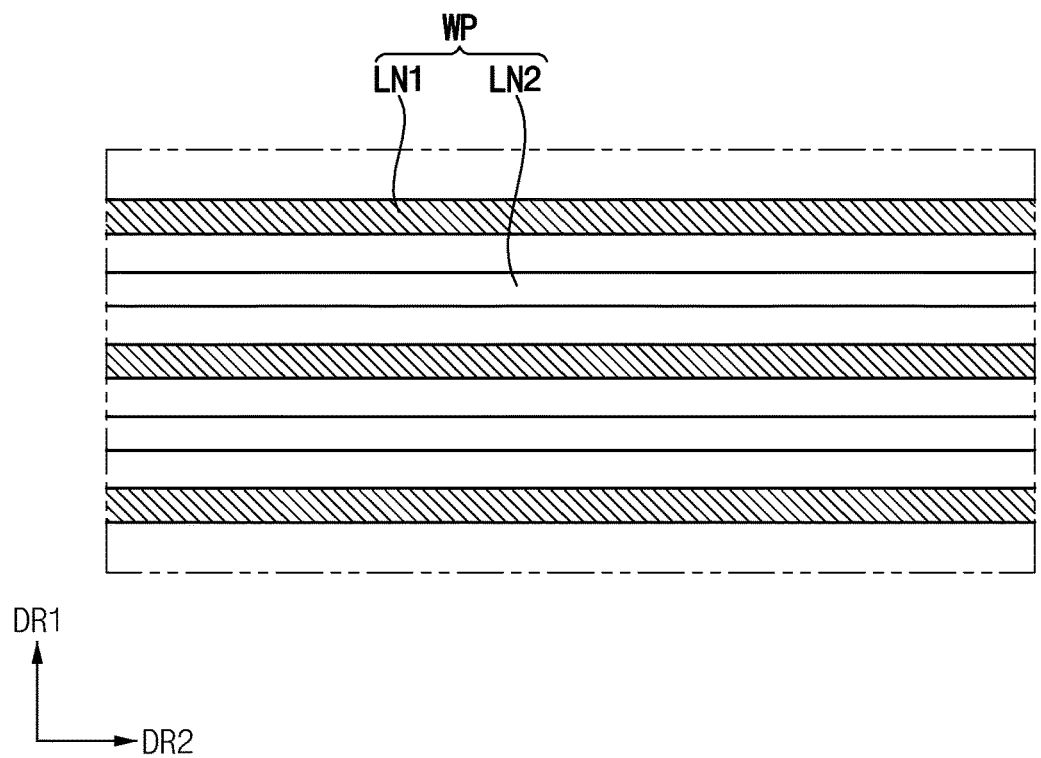
FIG. 14 is a plan view illustrating another example of FIG. 12.

FIG. 11 is a plan view of a display device according to another embodiment. FIG. 12 is an enlarged plan view of area B of FIG. 11. FIG. 13 is a cross-sectional view taken along line V-V' of FIG. 12. FIG. 14 is a plan view illustrating another example of FIG. 12.

A description of a display device 11 described with reference to FIGS. 11, 12, 13, and 14 overlapping the display device 10 described with reference to FIG. 1 may be omitted.

Referring to FIGS. 11, 12, 13, and 14, the second non-display area NDA2 may be positioned between the first non-display area NDA1 and the third non-display area NDA3. In the second non-display area NDA2, a substrate SUB, a buffer layer BFR including an inorganic material, a first insulation layer IL1, a second insulation layer IL2, a third insulation layer IL3, and an inorganic film IF may be disposed.

In the second non-display area NDA2, a wiring part WP may be disposed on the substrate SUB. The wiring part WP may be connected to the data line DL in the first non-display area NDA1 and may be connected to the pad PD in the third non-display area NDA3.

In the second non-display area NDA2, the inorganic film IF may protrude along a profile of an upper surface of another overlapping member. For example, in the second non-display area NDA2, the inorganic film IF may overlap the wiring part WP. An upper surface of a portion of the inorganic film IF overlapping the wiring part WP may protrude along a profile of the upper surface of the wiring part WP.

In an embodiment, the wiring part WP may include first wirings LN1 and second wirings LN2. The first wirings LN1 may be disposed on the same layer each other. The second wirings LN2 may be disposed on the same layer each other. The first wirings LN1 and the second wirings LN2 may be disposed on different layers.

The first wirings LN1 may be disposed on the first insulation layer IL1. The first wirings LN1 may be disposed on the same layer as the gate electrode E1. The second wirings LN2 may be disposed on the second insulation layer IL2. The second wirings LN2 may be disposed on the same layer as the upper electrode E2.

As depicted on FIG. 12, the first wirings LN1 may obliquely extend in a second direction DR2 crossing the first direction DR1. The second wirings LN2 may obliquely extend in parallel with the first wirings LN1. The second wirings LN2 may be alternately disposed with the first wirings LN1. However, as depicted on FIG. 14, the first wirings LN1 may horizontally extend in the second direction DR2 crossing the first direction DR1. The second wirings LN2 may extend in parallel with the first wirings LN1. That is, in this case, each of the first wirings LN1 and the second wirings LN2 may not be overlapped each other. The second wirings LN2 may be alternately disposed with the first wirings LN1 along the first direction DR1.

For example, the first direction DR1 may mean a linear direction from the bank BK to the dam DAM. For example, the second direction DR2 may be a direction obliquely crossing the first direction DR1 (refer to FIG. 12). Alternatively, the second direction DR2 may be a direction orthogonal to the first direction DR1 (refer to FIG. 14). However, embodiments according to the present disclosure are not limited thereto.

In an embodiment, since the first wirings LN1 and the second wirings LN2 extend in the second direction DR2 obliquely or orthogonal to the first direction DR1 in the second non-display area NDA2, the organic residual layer may not remain in the second non-display area NDA2. Since surface of the inorganic film IF partially protrudes due to the first and second wirings LN1 and LN2 extending in the second direction DR2, the organic residual film may not remain in the second non-display area NDA2. Accordingly, moisture permeation through the organic residual layer may be prevented in the second non-display area NDA2. Accordingly, shrinkage of the display panel of the display device 11 (e.g., the display panel DP of FIG. 2) due to the moisture permeation may be prevented.

Figure 15:
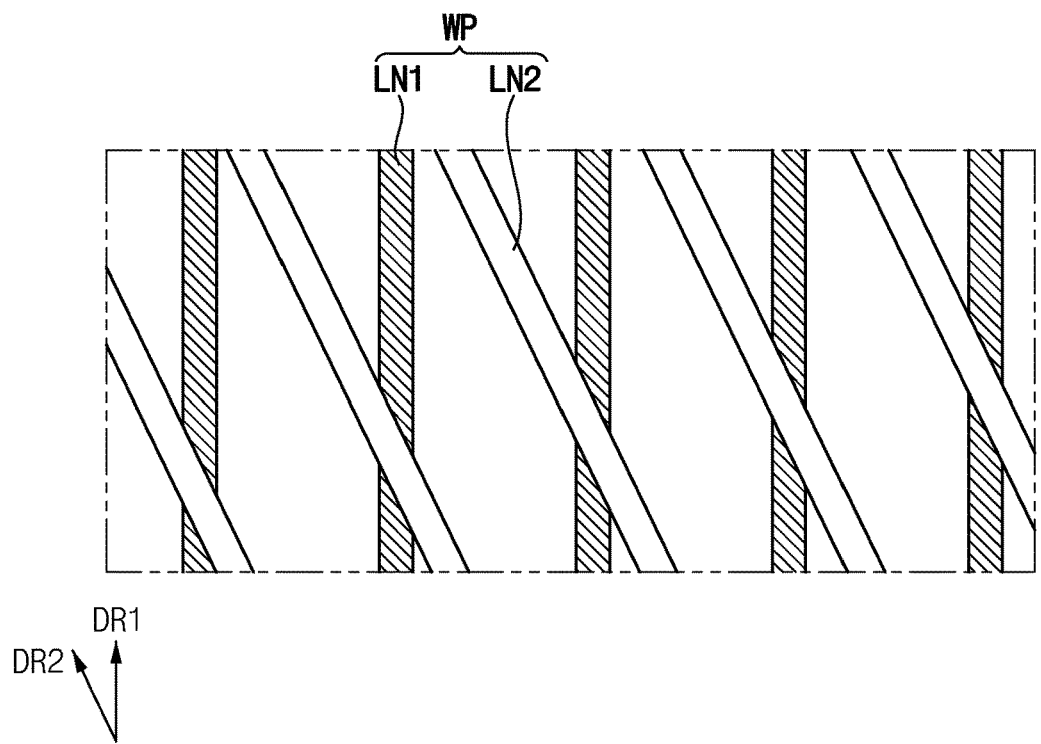
FIGS. 15 and 16 are plan views illustrating still other examples of FIG. 12.
Figure 16:
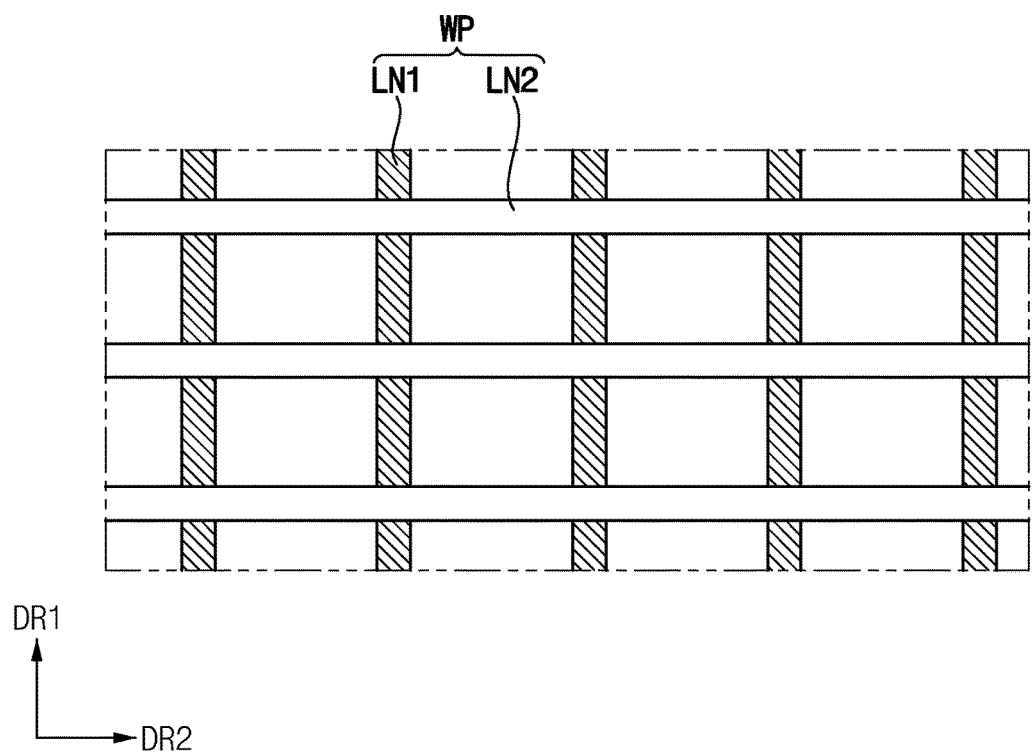

FIGS. 15 and 16 are plan views illustrating still other examples of FIG. 12.

Referring to FIGS. 15 and 16, the first wirings LN1 may extend in the first direction DR1. The second wirings LN2 may be disposed on the first wirings LN1, and the second wirings LN2 may extend in the second direction DR2 crossing the first direction DR1. Accordingly, the first wirings LN1 and the second wirings LN2 may cross each other in the second non-display area NDA2.

For example, the first direction DR1 may mean a linear direction from the bank BK to the dam DAM. For example, the second direction DR2 may be a direction obliquely crossing the first direction DR1 (refer to FIG. 15). Alternatively, the second direction DR2 may be a direction orthogonal to the first direction DR1 (refer to FIG. 16). However, embodiments according to the present disclosure are not limited thereto.

Figure 17:
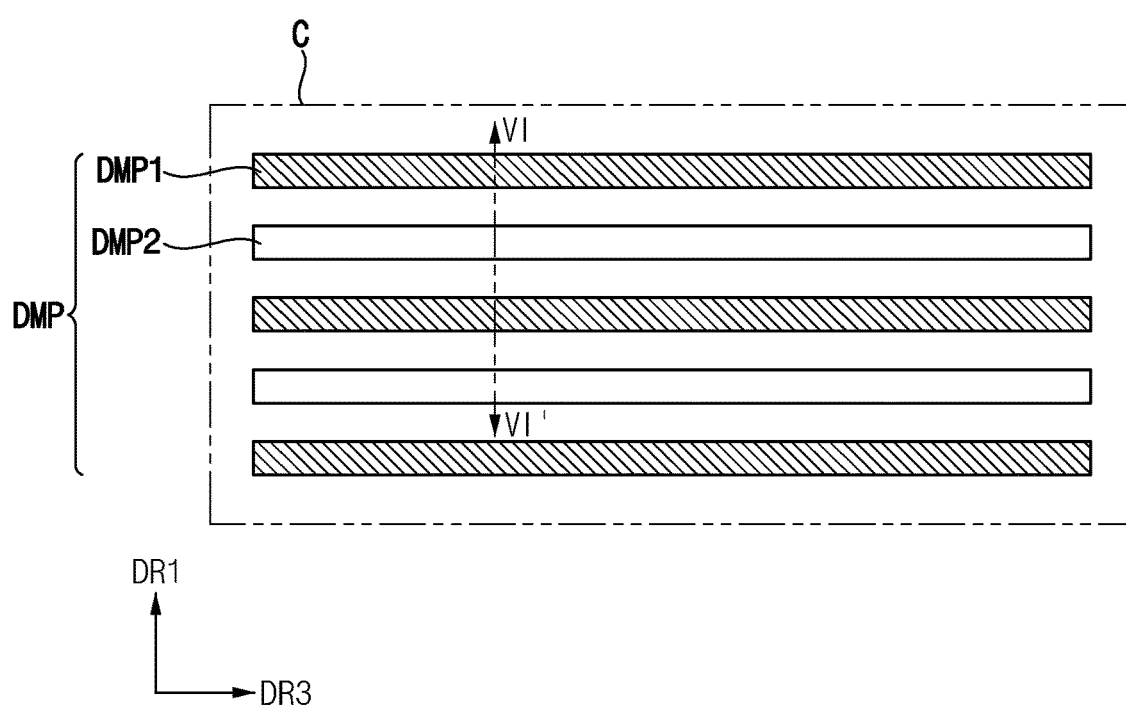
FIG. 17 is an enlarged plan view of area C of FIG. 11.
Figure 18:
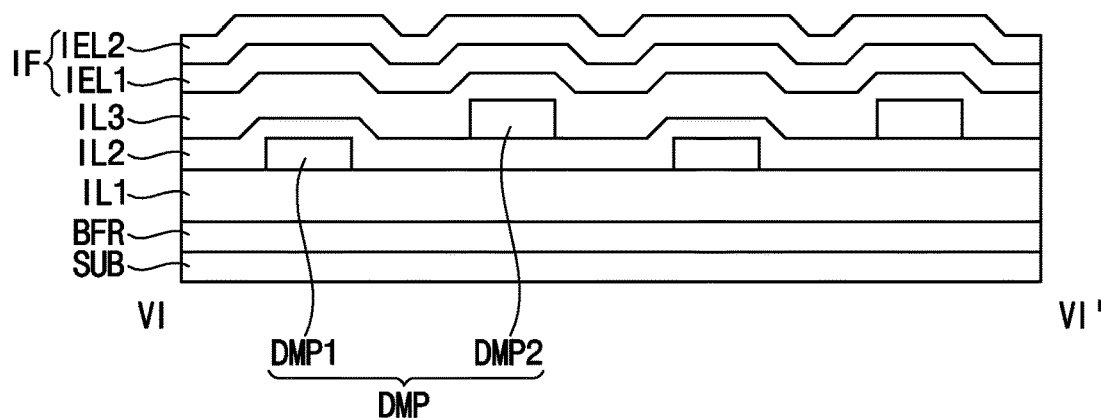
FIG. 18 is a cross-sectional view taken along line VI-VI' of FIG. 17.

FIG. 17 is an enlarged plan view of area C of FIG. 11. FIG. 18 is a cross-sectional view taken along line VI-VI' of FIG. 17.

Referring to FIGS. 11, 17, and 18, in an embodiment, the wiring part WP may be disposed only in a portion of the second non-display area NDA2. A dummy pattern part DMP may be disposed on the substrate SUB in the second non-display area NDA2 in which the wiring part WP is not disposed. The dummy pattern part DMP may be spaced apart from the wiring part WP.

In an embodiment, the dummy pattern part DMP may include first dummy patterns DMP1 and second dummy patterns DMP2. The first dummy patterns DMP1 may be disposed on the same layer. The second dummy patterns DMP2 may be disposed on the same layer. The first dummy patterns DMP1 and the second dummy patterns DMP2 may be disposed on different layers.

Each of the first dummy patterns DMP1 may have an island shape. That is, the first dummy patterns DMP1 may not be connected to other electrodes or wirings. Similarly, each of the second dummy patterns DMP2 may have an island shape. That is, the second dummy patterns DMP2 may not be connected to other electrodes or wirings.

The first dummy patterns DMP1 may be disposed on the first insulation layer IL1. The first dummy patterns DMP1 may be disposed on the same layer as the gate electrode E1 and the first wirings LN1. The second dummy patterns DMP2 may be disposed on the second insulation layer IL2. The second dummy patterns DMP2 may be disposed on the same layer as the upper electrode E2 and the second wirings LN2.

In the second non-display area NDA2, an inorganic film IF may be disposed. In the second non-display area NDA2, the inorganic film IF may protrude along a profile of an upper surface of another overlapping member. For example, in the second non-display area NDA2, the inorganic film IF may overlap each of the wiring part WP and the dummy pattern part DMP. An upper surface of a portion of the inorganic film IF overlapping the wiring part WP and the dummy pattern part DMP may protrude along the profile of the upper surfaces of the wiring part WP and the dummy pattern part DMP.

The first dummy patterns DMP1 may extend in a third direction DR3 crossing the first direction DR1. The second dummy patterns DMP2 may be disposed in parallel with the first dummy patterns DMP1. The second dummy patterns DMP2 may be alternately disposed with the first dummy patterns DMP1. The second dummy patterns DMP2 may extend in the third direction DR3.

For example, the first direction DR1 may mean a linear direction from the bank BK to the dam DAM. For example, the third direction DR3 may be a direction obliquely crossing the first direction DR1. Alternatively, the third direction DR3 may be a direction orthogonal to the first direction DR1. However, embodiments according to the present disclosure are not limited thereto.

Figure 19:
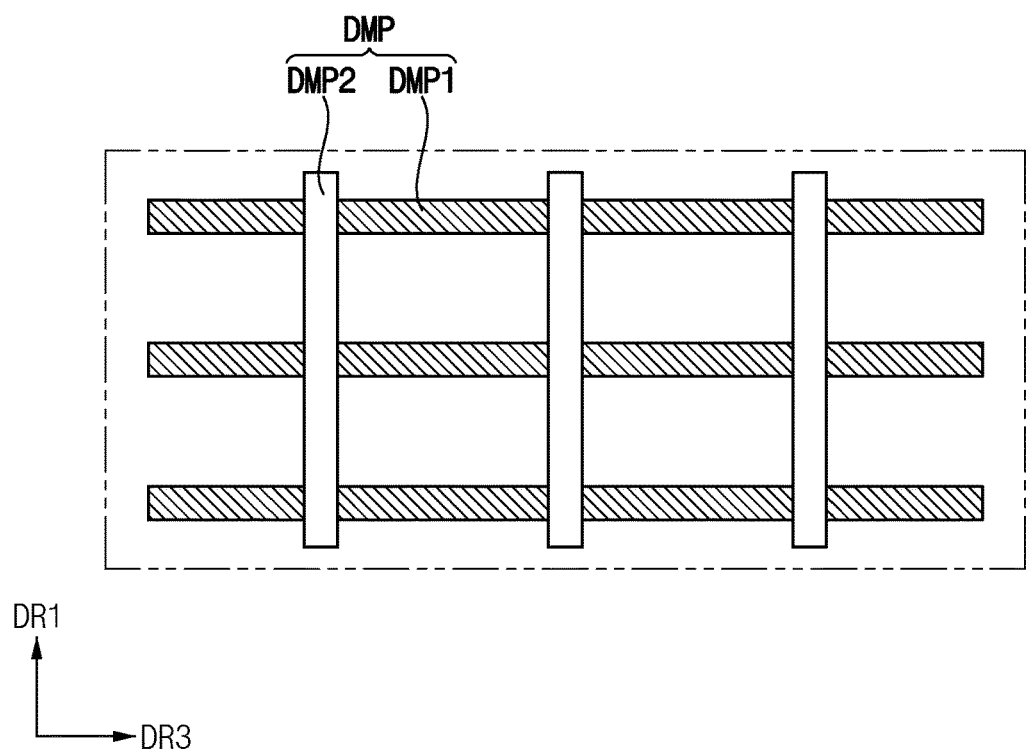
FIG. 19 is a plan view illustrating another example of FIG. 17.

FIG. 19 is a plan view illustrating another example of FIG. 17.

Referring to FIGS. 11 and 19, the first dummy patterns DMP1 may extend in the third direction DR3. The second dummy patterns DMP2 may be disposed on the first dummy patterns DMP1, and the second dummy patterns DMP2 may extend in the first direction DR1 crossing the third direction DR3. Accordingly, in a plan view, the first dummy patterns DMP1 and the second dummy patterns DMP2 may cross each other in the second non-display area NDA2.

For example, the first direction DR1 may mean a linear direction from the bank BK to the dam DAM. For example, the third direction DR3 may be a direction obliquely crossing the first direction DR1. Alternatively, the third direction DR3 may be a direction orthogonal to the first direction DR1. However, embodiments according to the present disclosure are not limited thereto.

In an embodiment, since the dummy pattern part DMP is disposed in a portion of the second non-display area NDA2 in which the wiring part WP is not disposed, an organic residual layer may not entirely remain in the second non-display area NDA2. A surface of the inorganic film IF may partially protrude due to the first dummy patterns DMP1 and the second dummy patterns DMP2 extending in the third direction DR3 or crossing each other. Accordingly, the organic residual layer may not remain in the second non-display area NDA2, and moisture permeation through the organic residual layer may be prevented in the second non-display area NDA2. Accordingly, shrinkage of the display panel of the display device 11 (e.g., the display panel DP of FIG. 2) due to the moisture permeation may be prevented.

The display devices according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
    a substrate including a display area, a first non-display area surrounding the display area, a second non-display area spaced apart from the display area and adjacent to the first non-display area, and a third non-display area spaced apart from the first non-display area and adjacent to the second non-display area;
    a data line disposed on the substrate in the display area;
    a dam disposed on the substrate in the first non-display area and including an organic material;
    a bank disposed on the substrate in the third non-display area and spaced apart from the dam;
    a wiring part disposed on the substrate, overlapping the second non-display area, connected to the data line, and including first wirings extending in a first direction and second wirings extending in a second direction crossing the first direction, wherein the first non-display area and the second non-display area do not include a connection point between the first wirings and the second wirings; and
    an inorganic film disposed on the substrate in the display area, the first non-display area, the second non-display area, and the third non-display area, and covering the dam, the bank, and the wiring part.

2. The display device of claim 1, wherein the first wirings and the second wirings cross each other in the second non-display area.

3. The display device of claim 1, wherein the first wirings are disposed on a different layer from the second wirings.

4. The display device of claim 3, wherein the first direction is a linear direction from the bank to the dam, and
    the second direction is a direction obliquely crossing the first direction or a direction orthogonal to the first direction.

5. The display device of claim 1, wherein an upper surface portion of the inorganic film overlapping the wiring part in the second non-display area protrudes along a profile of an upper surface of the wiring part.

6. The display device of claim 1, wherein the dam includes an organic layer extending from the display area.

7. The display device of claim 1, further comprising:
    a transistor disposed in the display area and including an active layer disposed on the substrate, a gate electrode disposed on the active layer, and a source electrode and a drain electrode disposed on the gate electrode.

8. The display device of claim 7, further comprising:
    an upper electrode disposed on the gate electrode.

9. The display device of claim 8, wherein each of the first wirings is disposed on the same layer as the gate electrode.

10. The display device of claim 8, wherein each of the second wirings is disposed on the same layer as the upper electrode.

11. The display device of claim 1, further comprising:
    a pad disposed in the third non-display area.

12. The display device of claim 11, wherein each wiring of the wiring part is connected to the pad.

13. A display device comprising:
    a substrate including a display area, a first non-display area surrounding the display area, a second non-display area spaced apart from the display area and adjacent to the first non-display area, and a third non-display area spaced apart from the first non-display area and adjacent to the second non-display area;
    a data line disposed on the substrate in the display area;
    a dam disposed on the substrate in the first non-display area and including an organic material;
    a bank disposed on the substrate in the third non-display area and spaced apart from the dam;
    a wiring part disposed on the substrate, overlapping the second non-display area, connected to the data line, and including first wirings extending in a direction crossing a vertical direction from the bank to the dam and second wirings extending in the direction, wherein the first non-display area and second non-display area do not include a connection point between the first wirings and the second wirings;
    a dummy pattern part disposed on the substrate in the second non-display area and spaced apart from the wiring part; and
    an inorganic film disposed on the substrate in the display area, the first non-display area, the second non-display area, and the third non-display area, and covering the dam, the bank, and the wiring part.

14. The display device of claim 13, wherein an upper surface of a portion of the inorganic film overlapping each of the wiring part and the dummy pattern part in the second non-display area protrudes along a profile of an upper surface of each of the wiring part and the dummy pattern part.

15. The display device of claim 13, wherein the dummy pattern part includes first dummy patterns and second dummy patterns disposed on a different layer from the first dummy patterns,
the first dummy patterns are disposed on the same layer as the first wirings, and
the second dummy patterns are disposed on the same layer as the second wirings.

16. The display device of claim 15, wherein the first dummy patterns extend in a direction obliquely crossing the vertical direction or in a direction orthogonal to the vertical direction, and
the second dummy patterns are disposed in parallel with the first dummy patterns and do not overlap the first dummy patterns.

17. The display device of claim 15, wherein the first dummy patterns and the second dummy patterns cross each other in a plan view.

18. The display device of claim 15, further comprising:
a transistor disposed in the display area and including an active layer disposed on the substrate, a gate electrode disposed on the active layer, and a source electrode and a drain electrode disposed on the gate electrode; and
an upper electrode disposed on the gate electrode.

19. The display device of claim 18, wherein each of the first dummy patterns is disposed on the same layer as the gate electrode, and
each of the second dummy patterns is disposed on the same layer as the upper electrode.

20. The display device of claim 15, wherein each of the first dummy patterns and the second dummy patterns has an island shape.

* * * * *